US006804162B1

(12) United States Patent
Eldridge et al.

(10) Patent No.: US 6,804,162 B1
(45) Date of Patent: Oct. 12, 2004

(54) READ-MODIFY-WRITE MEMORY USING READ-OR-WRITE BANKS

(75) Inventors: Matthew Eldridge, Atherton, CA (US); Robert Homan Igehy, Los Altos, CA (US)

(73) Assignee: T-Ram, Inc., San Jose, CA (US)

( * ) Notice: Subject to any disclaimer, the term of this patent is extended or adjusted under 35 U.S.C. 154(b) by 116 days.

(21) Appl. No.: 10/117,501

(22) Filed: Apr. 5, 2002

Related U.S. Application Data

(60) Provisional application No. 60/281,774, filed on Apr. 5, 2001.

(51) Int. Cl.[7] .................................................. G11C 8/00
(52) U.S. Cl. ........................... 365/230.03; 365/230.01; 365/230.06; 365/230.08
(58) Field of Search ..................... 365/230.03, 230.01, 365/230.06, 230.08

(56) References Cited

U.S. PATENT DOCUMENTS

| | | | |
|---|---|---|---|
| 3,918,033 A | 11/1975 | Case et al. ................... | 365/180 |
| 3,986,177 A | 10/1976 | Picquendar et al. ........ | 365/180 |
| 4,090,254 A | 5/1978 | Ho et al. ..................... | 365/150 |
| 4,146,902 A | 3/1979 | Tanimoto et al. ........... | 257/381 |
| 4,590,589 A | 5/1986 | Gerzberg ..................... | 365/100 |
| 4,612,448 A | 9/1986 | Strack ......................... | 327/436 |
| 4,677,455 A | 6/1987 | Okajima ..................... | 257/146 |
| 4,740,922 A * | 4/1988 | Ogawa .................. | 365/189.04 |
| 4,959,703 A | 9/1990 | Ogura et al. ................ | 257/133 |
| 5,321,285 A | 6/1994 | Lee et al. .................... | 257/296 |
| 5,324,966 A | 6/1994 | Muraoka et al. ............ | 257/136 |
| 5,381,363 A * | 1/1995 | Bazes ........................... | 365/51 |
| 5,390,145 A | 2/1995 | Nakasha et al. ............ | 365/159 |
| 5,396,454 A | 3/1995 | Nowak ........................ | 365/154 |
| 5,412,598 A | 5/1995 | Shulman ..................... | 365/174 |
| 5,464,994 A | 11/1995 | Shinohe et al. ............. | 365/175 |
| 5,471,419 A | 11/1995 | Sankaranarayanan et al. ........................... | 365/177 |
| 5,525,820 A | 6/1996 | Furuyama .................... | 257/296 |
| 5,543,652 A | 8/1996 | Ikeda et al. ................. | 257/377 |
| 5,587,944 A | 12/1996 | Shen et al. .................. | 257/147 |
| 5,629,894 A * | 5/1997 | Cho et al. ............... | 365/189.01 |
| 5,689,458 A | 11/1997 | Kuriyama .................... | 365/159 |
| 5,874,751 A | 2/1999 | Iwamuro et al. ............ | 327/108 |
| 5,910,738 A | 6/1999 | Shinohe et al. ............. | 257/140 |
| 5,914,503 A | 6/1999 | Iwamuro et al. ............ | 257/133 |
| 5,936,267 A | 8/1999 | Iwamuro ..................... | 257/147 |
| 5,939,736 A | 8/1999 | Takahashi ................... | 257/147 |
| 5,981,984 A | 11/1999 | Iwaana et al. .............. | 257/138 |
| 6,229,161 B1 | 5/2001 | Nemati et al. .............. | 257/133 |

FOREIGN PATENT DOCUMENTS

| | | |
|---|---|---|
| FR | 2110326 | 6/1972 |
| JP | 57 208177 | 12/1982 |

OTHER PUBLICATIONS

F.Nemati and J.D. Plummer, *A Novel High Density, Low Voltage SRAM Cell with a Vertical NDR Device*, Center for Integrated Systems, Stanford University, Stanford, CA 94305, Jun. 1998.

F.Nemati and J.D. Plummer, *A Novel Vertical Storage SRAM Cell*, Student Paper written for Center for Integrated Systems, Stanford University, Stanford, CA 94305.

(List continued on next page.)

*Primary Examiner*—Van Thu Nguyen
*Assistant Examiner*—Pho M. Luu

(57) ABSTRACT

Minimal memory access times are realized by using a single access to a read-modify-write bank. A read-modify-write memory including at least one read-or-write bank is operated in a manner that uses at most one access to each of the at least one read-or-write banks for each read-modify-write access to the memory during a memory cycle. The access can be effected during a single clock cycle and can be used for read, write and read-modify-write memory access.

57 Claims, 6 Drawing Sheets

OTHER PUBLICATIONS

F. Nemati and J.D. Plummer, *A Novel Thyristor–based SRAM Cell (T–RAM) for High–Speed, Low–Voltage, Giga–scale Memories*, Center for Integrated Systems, Stanford University, Stanford, CA, 1999.

Baliga, B.Jayant, *Modern Power Devices*, pp. 349–350, 1987.

Plummer, James D. and Scharf, Brad W., *Insulated–Gate Planar Thyristors: I–Structure and Basic Operation*, pp. 380–386, Feb. 1980.

S. M. Sze, *Physics of Semiconductor Devices Second Edition*, John Wiley & Sons, pp. 198–209, 1981.

* cited by examiner

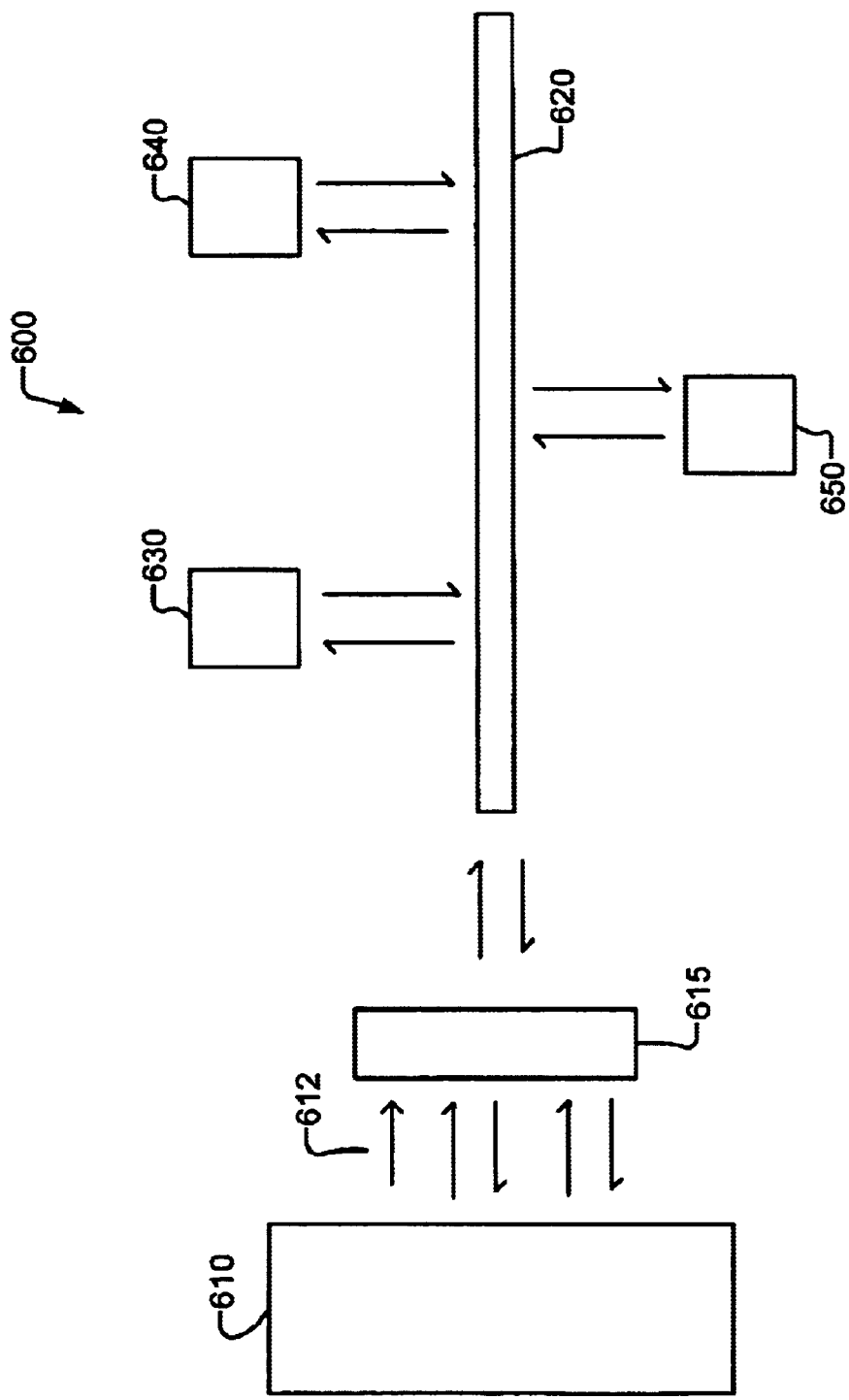

READ-MODIFY-WRITE MEMORY USING READ-OR-WRITE BANKS

RELATED PATENT DOCUMENTS

This claims benefit of U.S. Provisional Patent Application Ser. No. 60/281,774 filed on Apr. 5, 2001 and entitled "Read-modify-write Memory from Multiple Read-or-write Banks," to which priority is claimed under 35 U.S.C. §120 for common subject matter.

FIELD OF THE INVENTION

The present invention is directed to semiconductor devices and, more specifically, to semiconductor devices relating to read-modify-write memory and multiple read-or-write banks.

BACKGROUND

A variety of memory applications, such as SRAM, DRAM, thin capacitively coupled thyristor applications and others, include a read-or-write bank having a set of memory cells for read-or-write data access. In a minimally prescribed amount of time (hereinafter a "bank cycle"), data is read from or written to a subset of those cells (hereinafter a "word"). The read-or-write access rate of such a memory is the frequency at which read or write operations may be performed, and is comparable to the inverse of the bank cycle time, with the bank cycle time increasing as the capacity of the bank increases.

An array of read-or-write banks can be combined in a read-or-write memory to attain a large memory capacity while keeping the bank cycle time of the memory to a minimum. In such a memory, a "memory cycle" is the time in which a word can be read from or written to the read-or-write memory via access to an appropriate read-or-write bank. Thus, the memory cycle time of the memory is typically comparable to or greater than the bank cycle time. The read-or-write access rate of such a memory array is the frequency at which read or write operations can be performed, and is comparable to the inverse of the memory cycle time.

Read-modify-write data access is another type of data access that is desirable in a variety of memory applications. In such applications, one or more words of data are read from memory, modified and written back into the memory. For brevity, further discussion is limited to single words with the understanding that this following discussion of example embodiments can be extended to multiple words of data In some instances, read-or-write memory has been utilized to support read-modify-write operations. For example, one memory cycle can be used to read a word that is subsequently modified over a period of zero or more memory cycles. The word is then written back to the memory in another memory cycle. The modification of the data does not actually use the memory: therefore, other memory accesses may be interleaved during the period of time during which the data is being modified. Thus, this read-or-write memory has a read-modify-write access using two memory operations, with two corresponding memory cycles, from the read-or-write memory. Therefore, the read-modify-write access rate of the memory (e.g., the frequency with which read-modify-write operations may be performed) has been one half the read-or-write access rate.

SUMMARY

The present invention is directed to the above-discussed subject matter and others relating to the devices where minimum access rate is a concern. The present invention is exemplified in a number of implementations and applications, some of which are summarized below.

According to an example embodiment of the present invention, a read-modify-write memory includes a read-or-write bank, and the read-modify-write access rate of the memory is about equal to the read-or-write access rate of the read-or-write bank. In one implementation, the memory includes one or more read-or-write banks coupled with a single read-modify-write bank, hereinafter a "cache." At most one access to any given read-or-write bank is generated for each read-modify-write access to the memory. In this manner, the memory supports a read-modify-write access rate that is about equal to the slowest of the cache and the read-or-write bank access rates.

In a more particular example embodiment of the present invention, read access is effected from a read-modify-write memory having at least one read-or-write bank and a cache using one access to a read-or-write bank for each read access to the memory. An incoming address request is received and a word from a read-or-write bank corresponding to the incoming address is read. A word is also read from a row of a cache corresponding to the row of the read-or-write bank, along with a cache tag that indicates which read-or-write bank's word is contained in the cache. In response to the tag indicating that the cache contains the word of the read-or-write bank corresponding to the incoming address, data (e.g., one or more words) is returned from the cache for the read access. When the tag indicates that the cache does not contain the word of the read-or-write bank corresponding to the incoming address, data is returned from the read-or-write bank for the read access.

In another example embodiment of the present invention, a write access is effected from a read-modify-write memory having at least one read-or-write bank and a cache using one access to the read-or-write bank for each write access to the memory. An incoming address request is received and a cache tag that indicates which read-or-write bank's word is contained in the cache is read. In response to the tag indicating that the cache contains the word of the read-or-write bank corresponding to the incoming address, data (e.g., one or more words) is written to the cache for the write access. When the tag indicates that the cache does not contain the word of the read-or-write bank corresponding to the incoming address, data is written to the read-or-write bank for the write access.

In still another example embodiment of the present invention, a read-modify-write access is effected from a read-modify-write memory having at least one read-or-write bank and a cache using one access to the read-or-write bank for each write access to the memory. An incoming address request is received, a word is read from a read-or-write bank corresponding to the incoming address and from a row of the cache corresponding to a row of the read-or-write bank at the incoming address, and a cache tag that indicates which read-or-write bank's word is contained in the cache is also read. In response to the cache tag indicating that the cache contains the word of the read-or-write bank corresponding to the incoming address,.the word read from the cache is modified and written back to the cache. When the tag indicates that the cache does not contain the word of the read-or-write bank corresponding to the incoming address, the word read from the cache is written to the read-or-write bank corresponding to the tag, the word read from the read-or-write bank corresponding to the incoming address is modified and written to the cache. In addition, the cache tag is updated to indicate that the word in the cache now contains the word from the read-or-write bank corresponding to the incoming address.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIG. 6 is a circuit arrangement having a read-modify-write memory arrangement, according to another example embodiment of the present invention.

Figure 1:
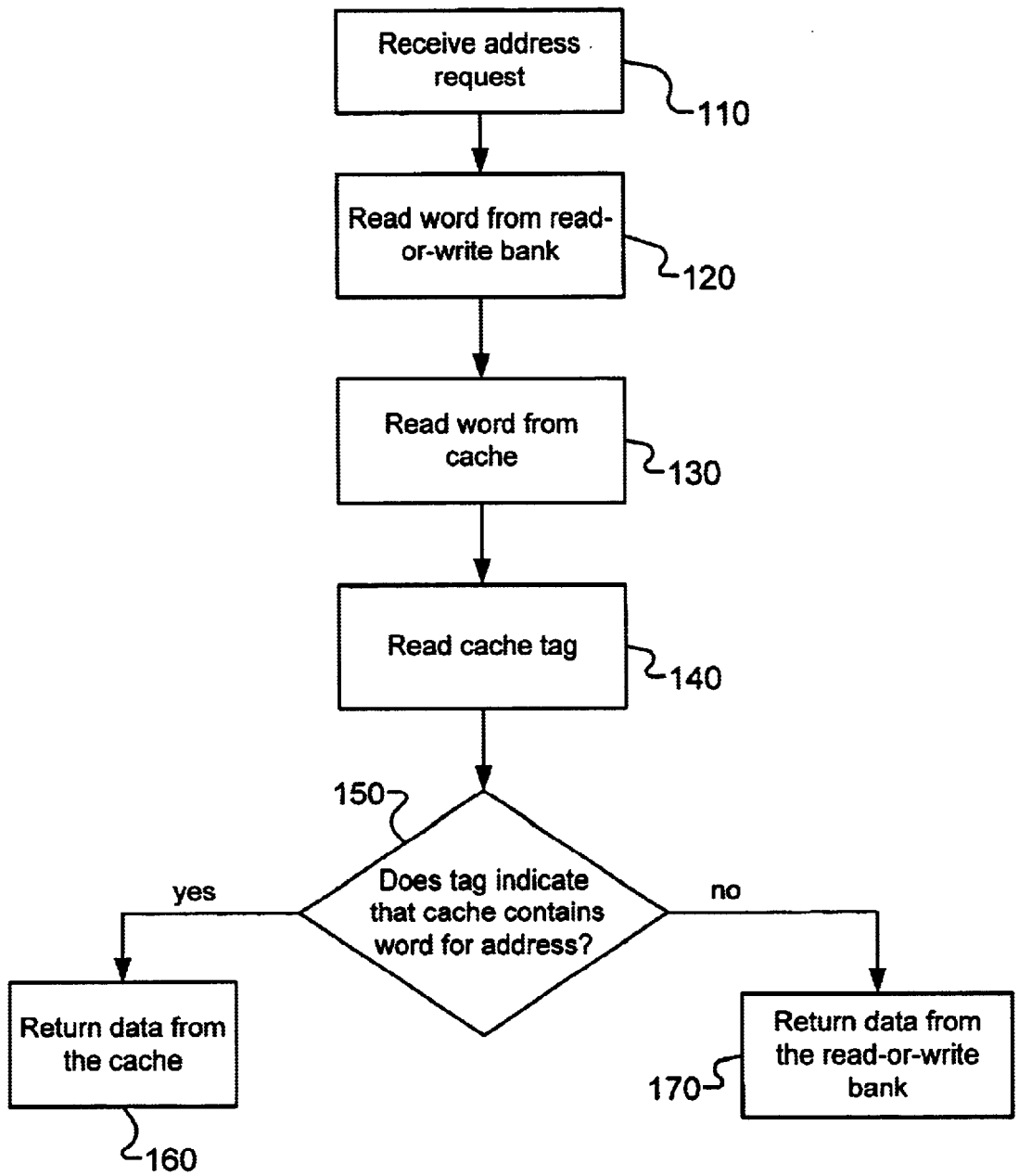
FIG. 1 is a flow diagram for read access, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of memory applications, and has been found to be particularly useful for devices including read-modify-write memory and read-or-write banks. While the present invention is not necessarily limited to such devices, various aspects of the invention may be appreciated through a discussion of various examples using this context.

According to an example embodiment of the present invention, one or more read-or-write banks and a single read-modify-write bank are used to provide a memory that supports a read-modify-write cycle time less than the sum of the memory read cycle time and memory write cycle time. The single bank of read-modify-write memory is used as a cache (hereby referred to interchangeably as the "cache") for the one or more banks of read-or-write memory. Addresses in the memory are partitioned into a bank address, which identifies a particular read-or-write bank, and a row address, which identifies a particular word within that bank. The cache and the read-or-write banks are used to generate at most one access to any given read-or-write bank for each read-modify-write access to the memory.

The storage capacity of the cache is sufficient to manage the storage capacity of the largest read-or-write bank. In one instance, a cache having a storage capacity of equal to or greater than the storage capacity of the largest read-or-write bank is used. In another instance, the storage capacity of the cache used is at least equal to the storage capacity of the largest read-or-write bank, less the amount of storage that is provided by pipeline registers.

For the sake of brevity, example embodiments and implementations thereof described herein assume identical banks, and a direct-mapped cache of the same size and organization as the banks. However, these examples extend to non-identical banks and different cache structures. In a direct-mapped cache, the number and size of the words matches that of a bank, and the word accessed is determined by the row address. Each word in the cache also has an associated tag that indicates which bank's word is contained in the cache.

FIG. 1 is a flow diagram of a method for read access to a memory having a cache, a cache tag and a read-or-write memory bank, according to another example embodiment of the present invention. An incoming read address request is received at block 110, the row of the read-or-write bank (e.g., the word) corresponding to the incoming address is read at block 120, and the corresponding row of the cache is read at block 130. A cache tag is read at block 140 for a tag access and check, where the tag indicates which read-or-write bank's word is in the cache. At block 150, the read tag address is compared to the incoming address. If the cache tag for the selected word matches the addressed bank, then the data from the cache is returned at block 160. If the cache tag for the selected word does not match the addressed bank, the data from the addressed read-or-write bank is returned at block 170.

The cache tag is read in a variety of sequences, depending upon the application. In one implementation, the tag access and check proceeds in parallel with the cache read and bank read, and the time required to perform at least a portion of the tag check is hidden within the cache and bank access times. In another implementation, the cache tag is checked before either or both the cache and the selected bank are read, and if the cache tag matches the bank address then the data is read and returned from the cache, otherwise the data is read and returned from the bank.

In a more particular implementation, the data read from the bank on a cache miss is written to the cache. In this case, the data displaced from the cache is written back to the bank specified by the cache tag and the cache tag is updated with the new bank address. The bank read access is guaranteed to be to a different bank because there was a cache miss; thus, the bank corresponding to the displaced data from the cache has a free cycle available to perform a write-back of the displaced data.

In another implementation, the data read from the cache on a cache hit is written back to the cache (e.g., when the tag indicates that the cache includes the word of the bank at the incoming address). The tag is optionally re-written with the same bank address. In addition, the tag check is optionally effected before the bank access, such that the bank is not occupied with a read, and the data read from the cache is also written back to the bank.

Various other implementations of the read access described above can also be realized. For example, the read can be effected using at most one read-modify-write access to the cache and the cache tags, and at most one read access to a single bank and one write access to a different bank. In another alternative implementation, a memory read access is treated in the same way as a read-modify-write access described below, except where modification of the data is not performed.

Figure 2:
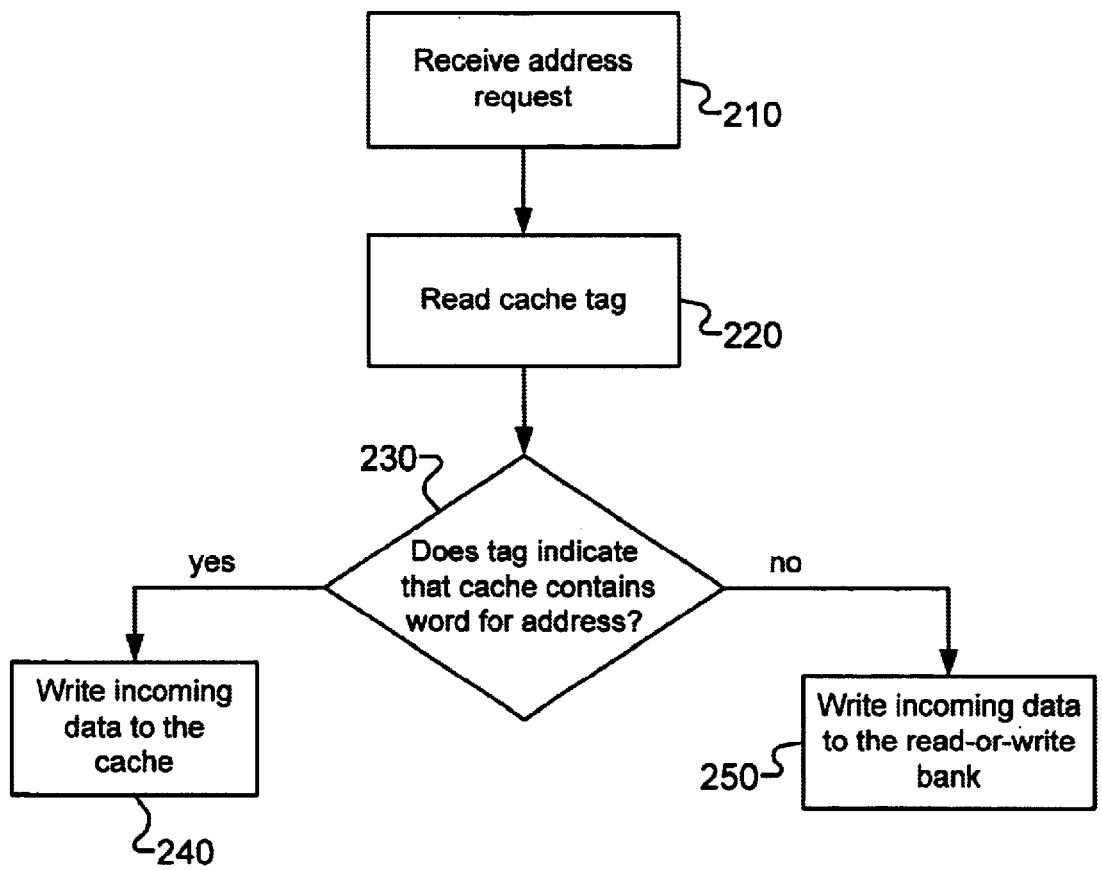
FIG. 2 is a flow diagram for write access, according to another example embodiment of the present invention.

FIG. 2 shows example approaches for write access to a memory having a cache, a cache tag and a read-or-write bank, according to another example embodiment of the present invention. At block 210, an incoming write address request with data is received, and the cache tag is read at block 220. The tag address is compared to the incoming address request at block 230. When the tag indicates that the cache includes the word of the bank addressed in the incoming address request (e.g., a cache hit), the incoming data is written to the cache (e.g., a write-back cache) at block 240. In another such approach, the incoming data is also written to the bank (e.g., a write-through cache), which takes advantage of the bank having a free cycle. In yet another such approach, the data is only written to the bank, and the cache entry is invalidated instead of being updated.

When the tag indicates that the cache does not include the word of the bank addressed in the incoming address request (e.g., a cache miss), the data is written directly to the selected bank at block 250, leaving the contents of the cache undisturbed. The data from the cache can also be written back to the bank specified by the cache tag, which takes advantage of that bank not being otherwise occupied for that cycle. In other example variations where the data in the cache is written back to the bank, the incoming data may be written to the cache, to the bank, or to both the cache and the bank. When data is written to the cache, the cache tag is either updated to reflect the bank address corresponding to the address of the incoming request or invalidated.

Similar to the read access discussion above, each of the write accesses embodiments are adapted for effecting at most one read-modify-write access to the cache and the cache tags, and at most two write accesses to two different banks. In alternative implementations, the memory write access is treated in the same way as a read-modify-write access, as described below, except where the data read is ignored and replaced by the data being written.

Figure 3:
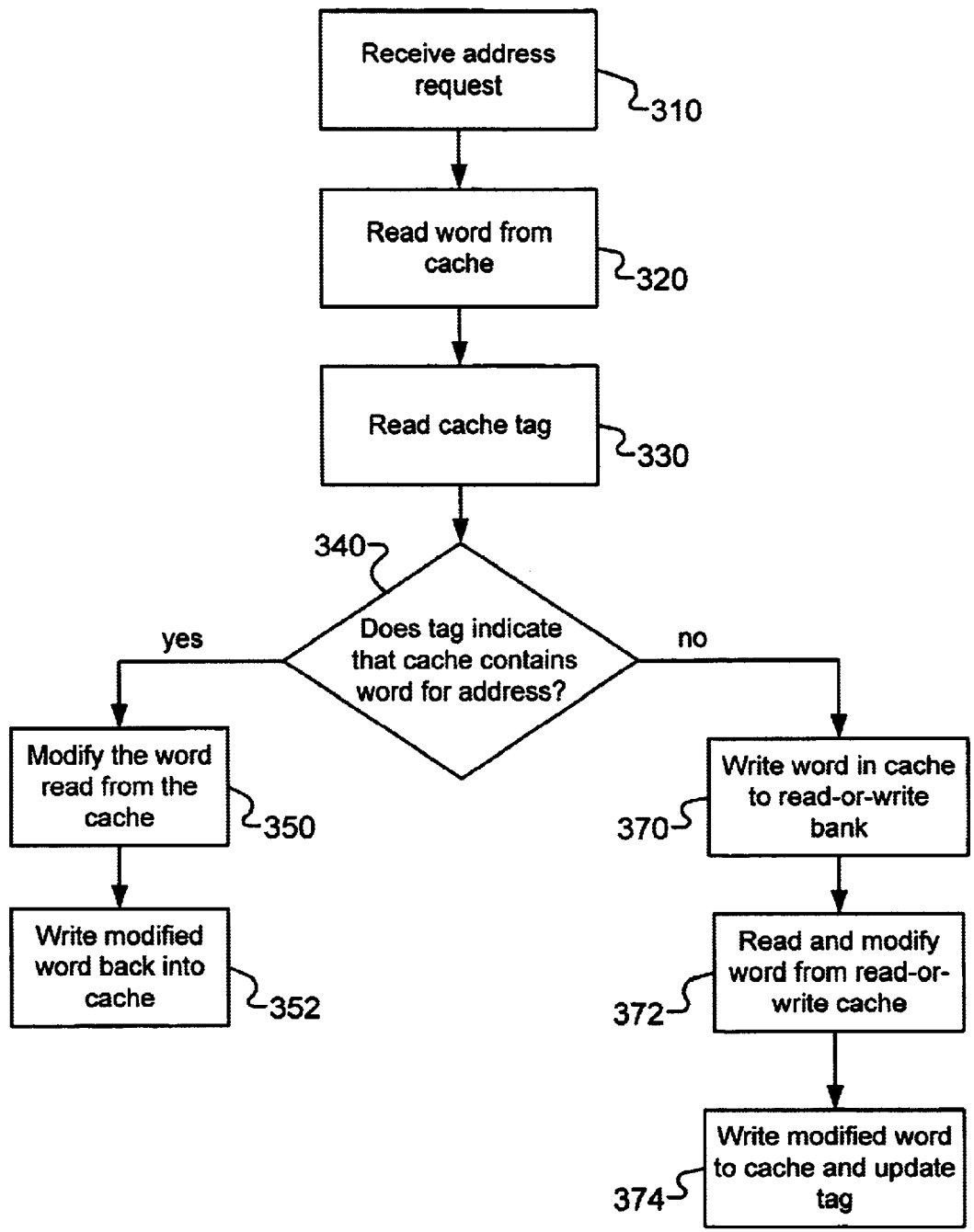
FIG. 3 is a flow diagram for read-modify-write access, according to another example embodiment of the present invention.

FIG. 3 shows a method for read-modify-write memory access using a cache, a cache tag and a read-or-write bank, according to another example embodiment of the present invention. A read-modify-write address request is received at block 310. A word is read from the cache at block 320, and the cache tag corresponding to that word is read at block 330. If the tag indicates that the cache contains a word for the incoming address at block 340 (e.g., a cache hit), the data is modified at block 350 and written back to the cache at block 352. If the tag indicates that the cache does not contain a word for the incoming address at block 340 (e.g., a cache miss), the contents of the cache are written back to the bank specified by the cache tag at block 370. At block 372, data is read from the bank at the address of the incoming address request and modified, and the modified word is written to the cache at block 374. Writing the modified word to the cache is useful, for example, when each bank is used to perform only one read or write access per cycle, where the selected bank may have already supplied a read access to satisfy the cache miss. The read-modify-write operation is adapted to effect the operation while performing at most one read-modify-write access on the cache and the cache tags, and at most one read access to a single bank and at most one write access to a different bank is made.

In each of the above example embodiments and implementations thereof, including those discussed in connection with FIGS. 1–3, the read and write steps can be performed in a variety of sequences. For example, tag checks, cache reads and/or bank reads can be performed simultaneously. In addition, referring to FIG. 3, the data from the bank address of the incoming address request can be read prior to determining whether the tag indicates that the cache contains the word for the incoming address at block 340. When the incoming address request is read prior to the tag determination, the data read from the bank address is ignored for a cache hit.

In another example embodiment, applicable to each of the above approaches, including those discussed in connection with FIGS. 1–3, a read-modify-write operation or a write operation that misses in the cache may require that the cache be both read from and written to. Such a read and write requirement of the cache is effected by a cache read operation that returns data in the cache to the appropriate bank, and a cache write operation that places the modified or written data into the cache. When the cache read/write operations occur on every cycle, the cache supports a read and a write operation on every cycle. Read-or-write banks with half the cycle time of the data banks, dual-ported banks that allow a read and a write access on every data bank cycle, or another arrangement that allows a read-modify-write access on every data bank cycle are used to implement the read-modify-write cache and tags. In one particular implementation, two read-or-write banks are augmented with one ping-pong bit per word. On a read-modify-write access, the ping-pong bit indicates which bank has the valid data to be read. The write is done to the bank not having valid data, and the ping-pong bit is toggled to indicate that the bank written to now has valid data.

Figure 4:
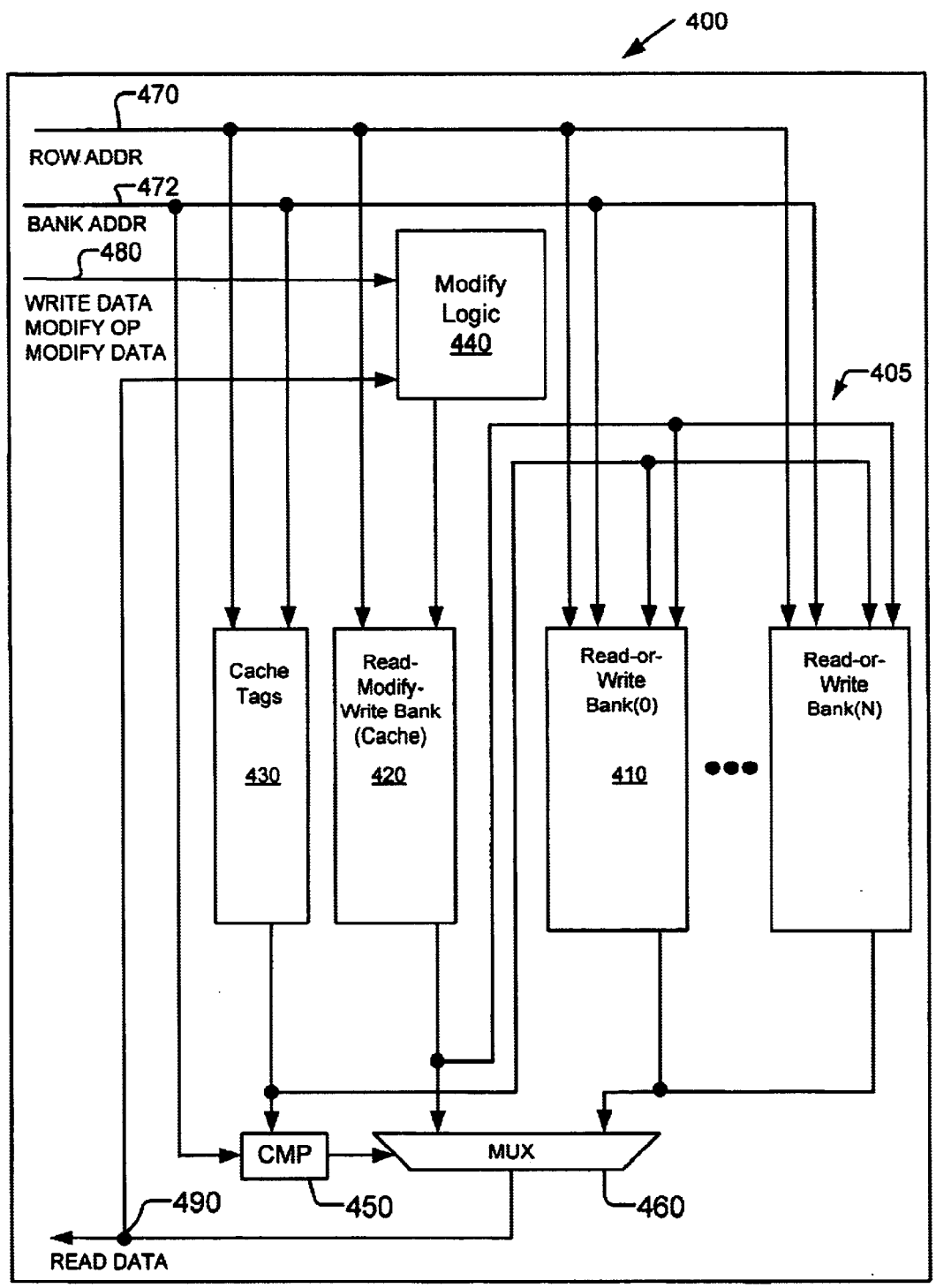
FIG. 4 is a read-modify-write memory arrangement, according to another example embodiment of the present invention.

Each of the example embodiments and implementations described herein can be implemented using a variety of circuit arrangements. FIG. 4 shows one such circuit arrangement 400 adapted to effect read-modify-write memory from multiple read-or-write banks, according to another example embodiment of the present invention. The circuit arrangement includes an array 405 of read-or-write banks having a plurality of read-or-write banks, including bank 410. A read-modify-write bank 420 is adapted to be used as a cache, and a cache tag 430 is adapted to be used to indicate the address of the bank having data in the cache. In one particular implementation, the cache and/or the cache tag 430 exhibit a read latency smaller than the data bank latency. Modify logic circuitry arrangement 440 is adapted and used to modify data during a read-modify-write operation.

Each of the cache tag 430, cache 420 and read-or-write banks in the array 405 are electrically coupled to incoming row and bank address lines via nodes 470 and 472, respectively, and are used for read and/or write applications, as discussed herein. A comparator 450 is configured and arranged to compare a value in the tag 430 with an incoming bank address received via node 472. A multiplexer 460 is electrically coupled to the cache and the array of banks, and is adapted to provide a read data output via node 490 in response to the comparator 450.

The arrangement in FIG. 4 can also be adapted for use in connection with other examples described herein. For instance,; using the read-modify-write access discussed in connection with FIG. 3 as an example, the arrangement of FIG. 4 is adapted so that an incoming address is received via nodes 470 and 472, and a word corresponding to the incoming address is read from the cache 420. The cache tag is also read for the incoming address, and the comparator 450 determines whether the cache tag matches the incoming bank address. If the tag matches the incoming address, the multiplexer 460 is directed to read out the word from the cache 420 corresponding to the incoming address to the modify logic circuitry arrangement 440. The word is modified according to data received via node 480, and written back into the cache 420. When the tag does not match the incoming address, the word in the cache 420 is written to the read-or-write bank corresponding to the tag address, and the comparator 450 directs the multiplexer 460 to read a word from the read-or-write bank corresponding to the incoming address to the modify logic circuit arrangement 440. The word is then modified at the modify logic circuit arrangement according to data received via node 480, and the modified word is written to the cache 420. The tag 430 is then updated to indicate that the cache includes the word of the read-or-write bank at the incoming address.

Figure 5:
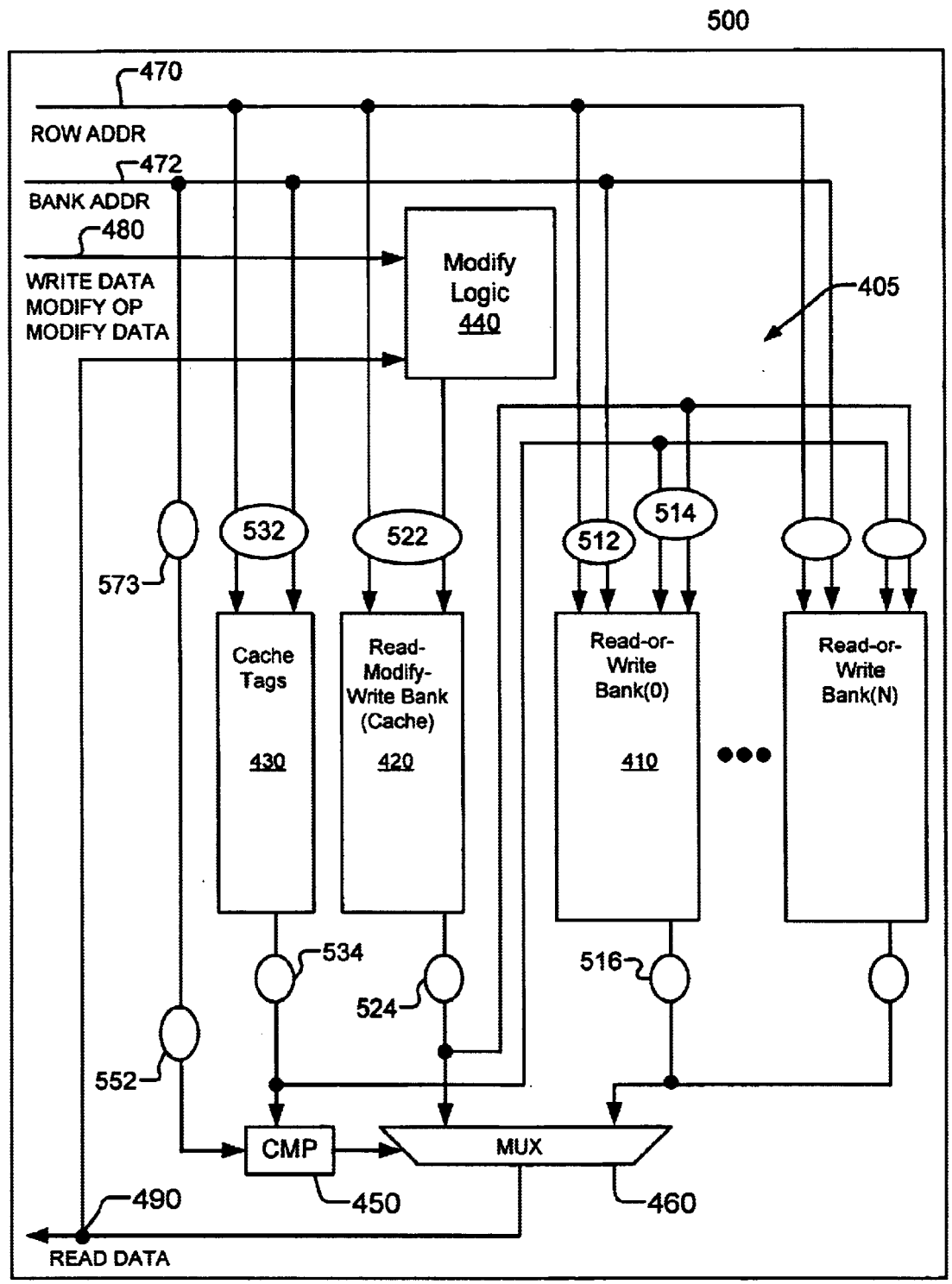
FIG. 5 is another read-modify-write memory arrangement, according to another example embodiment of the present invention.

FIG. 5 shows another circuit arrangement 500 adapted to effect read-modify-write memory from multiple read-or-write banks, according to another example embodiment of the present invention. Similar structures to those in FIG. 4 are labeled similarly, and discussion of those elements is limited where repetitive. In this regard, the circuit arrangement 500 is similar to circuit arrangement 400, with the arrangement 500 also including pipeline registers. Pipeline register 532 is electrically coupled between the cache tag 430 and row address line node 470, and between the cache tag 430 and bank address line node 472. Pipeline register 522 is electrically coupled between the cache 420 and row address line node 470, and the modify logic circuitry arrangement 440. Pipeline register 512 is electrically coupled between the bank 410 and incoming row and bank line nodes 470 and 472. Pipeline register 514 is electrically coupled between the bank and additional pipeline registers 534 and 524. Pipeline register 534 is also electrically coupled between the cache tag 430 and the comparator 450. Pipeline register 524 is also coupled between the cache 420 and the multiplexer 460. Pipeline registers 573 and 552 are electrically coupled to each other and between bank address line node 472 and the comparator 450, respectively. Pipeline register 516 is electrically coupled between the bank 410 and the multiplexer 460. Additional pipeline registers may also be used, such as in connection with additional banks in the array 405.

The pipeline registers are adapted to store data as it is transferred between the respective circuit elements. This data storage facilitates the separation of cache reads from their resultant data bank writes, and likewise the separation of data bank reads from their resultant cache writes, so the read-modify-write access rate of the memory may match the read-or-write access rate of the data banks. In a more implementation, pipeline forwarding is employed in connection with FIG. 5 in a manner that ensures that each read or read-modify-write memory access retrieves the most current data.

The single memory access embodiments employing pipeline registers can be applied in a variety of manners. In one implementation, a single memory access is used to perform a cache read followed by a write of the cache data to a bank. Similarly, a single memory access includes a data bank read followed by a cache write of the bank data in another instance. Furthermore, the modify operation of a read-modify-write memory access includes additional pipeline stages in another implementation.

In another example embodiment of the present invention, a partial word writes is effected (e.g., writing to only 8 bits of a 32-bit word) to banks that support writes to whole words only. For example, referring to FIG. 4, the read-or-write bank 410 may be implemented in a manner that does not support writes of partial words. In this implementation, all partial word writes are treated as a read-modify-write operation in which the read operation is used to access the whole word, the modify operation replaces the appropriate partial word in the whole word, and the write operation writes the whole word.

The partial word writes are useful in a variety of applications. In another implementation, the partial word writes are used to spatially separate cells accessed by the partial word write with cells from other partial words. This is useful, for example, in avoiding multi-bit soft error upsets to a partial word.

In another implementation, partial word writes are used to construct a logical memory out of several actual memories. The actual memories have separate data signals but share common control and address signals. Writes to the logical memory may be implemented as partial word writes to the actual memories. This is useful, for example, in placing memory spatially close to the data signals or pins from which the data will be read/written, thereby reducing the time required for accessing the memory and improving performance.

In another example embodiment, non-destructive bank reads (e.g., reading a word from a bank while leaving the value of the word in the bank unmodified) are effected using a destructive read bank while sustaining a full memory access rate. Typically, words stored in a destructive read bank are destroyed when read from the bank. However, in this example embodiment, all reads to the destructive read bank are treated as a read-modify-write operation in which a read operation extracts data from the bank, a modify operation leaves the data unchanged and a write operation restores the read value to the bank.

In a more particular example embodiment of the present invention, one or more of the example embodiments and implementations described herein are used in connection with DRAM memory, where the cycle time of the DRAM is reduced via the single access for the read-modify-write access. This is particularly useful in applications where DRAM reads can be destructive, and a significant portion of the cycle time for a read operation would be devoted to restoring the value of the data in the bank. The cycle time reduction is also useful in DRAM applications that lack selective writes, where writes of partial words require reading the entire word, updating the partial word, and writing the word back. In each of these applications, the cycle time is reduced from being determined by the necessity of performing both a read and a write of the bank to the larger of the time required to perform a single read or a single write.

In still another example embodiment of the present invention, a write-back cache uses a read-modify-write operation on cache write misses. The write-back cache replaces data in the cache on a write miss, requiring the data in the cache to be read from and written to. In this example embodiment, a read and a write can be performed on every cycle. This approach may be treated as a read-modify-write operation as discussed herein, where the "modify" portion of the operation includes the replacement of an old cache line with a new cache line.

In still another example embodiment of the present invention, error-correcting codes are supported at a granularity greater than the partial word write granularity. Error-correcting codes encode a collection of raw data into an encoded data format upon a write operation. Upon a read operation, the encoded data, which may have been corrupted since the write, is corrected and decoded back into the raw data. When an error-correcting code is employed across a word at a granularity greater than that of a partial word, partial word writes can use a read-modify-write operation to encode the new data. The read operation retrieves the word; the modify operation decodes the word, inserts the partial write, and re-encodes the word; and the write operation stores the newly encoded word into the bank.

In another example embodiment of the present invention, a late select of a read-or-write operation is performed on a per-bank basis. For example, when a tag is read simultaneously with a read from a read-or-write bank, the contents of the tag can be used to determine whether to return the data read from the read-or-write bank or the data read from the cache (e.g., on a cache hit, data from the cache is returned and on a cache miss, data from the read-or-write bank is returned).

FIG. 6 is a circuit arrangement 600 having a memory including an array of read-or-write banks and adapted to use only one access to each read-or-write bank for each read-modify-write access to the memory, according to another example embodiment of the present invention. A central processing unit (CPU) 610 is electrically coupled via links 612 to a decode and memory mapping circuit 615. The links 612 are adapted to communicate data including address data and control data. The decode and memory mapping circuit 615 is adapted to send and receive signals via a bus 620 in response to the communicated data from the CPU. The bus 620 is electrically coupled to a clock 630, a memory 640 and a peripheral device 650. The clock is adapted to provide a clock cycle to the circuit arrangement, and the peripheral device may include one or more of a variety of common devices, such as a USB port or a modem. When the CPU sends a signal to the decode and memory mapping circuit, such as a request for a read from a selected memory address, the decode and memory mapping circuit generates a signal that is sent via the bus for reading the selected memory address.

The memory 640 includes at least one read-modify-write bank adapted for use as a cache, a cache tag and at least one read-or-write bank. The circuit arrangement is adapted to use the memory 640 in a manner that uses only one access to each read-or-write bank for each read-modify-write access. A variety of memory arrangements can be adapted for use in connection with memory 640. For example, the circuit arrangements shown in FIGS. 4 and 5 may be used as memory 640, where the decode and memory mapping circuitry sends signals including the row address via node 470, the bank address via node 472 and modify logic instructions via node 480. In addition, when data is read out via node 490, the decode memory mapping circuitry 615 is adapted to receive the data and communicate the data to the CPU 610 via links 612.

While the present invention has been described with reference to several particular example embodiments, those skilled in the art will recognize that many changes may be made thereto without departing from the spirit and scope of the present invention, which is set forth in the following claims.

What is claimed is:

1. A circuit arrangement for providing read-modify-write memory, the circuit arrangement comprising:
    a memory having at least one read-or-write bank and further comprising a read-modify-write bank electrically coupled to the at least one read-or-write bank; and
    control circuitry adapted for using at most one access to each said at least one read-or-write bank for each read-modify-write access to the memory during a single memory access cycle;
    wherein the circuit arrangement is adapted to use at most one access to each said at least one read-or-write bank and only one access to the read-modify-write bank for each read-modify-write access to the memory; and
    wherein the read-modify-write bank has a cycle time that is smaller than the sum of the read cycle time and write cycle time of a slowest read-or-write bank in the memory arrangement, wherein the circuit arrangement is adapted to effect a read-modify-write cycle time that is smaller than the sum of the slowest read-or-write bank's read cycle time and write cycle time.

2. A circuit arrangement for providing read-modify-write memory, the circuit arrangement comprising:
    a memory having at least one read-or-write bank and further comprising a read-modify-write bank electrically coupled to the at least one read-or-write bank; and
    control circuitry adapted for using at most one access to each said at least one read-or-write bank for each read-modify-write access to the memory during a single memory access cycle;
    wherein the circuit arrangement is adapted to use at most one access to each said at least one read-or-write bank and only one access to the read-modify-write bank for each read-modify-write access to the memory; and
    wherein the at least one read-or-write bank includes a plurality of read-or-write banks and wherein the read-modify-write bank is adapted to be used as a cache for the plurality of read-or-write banks.

3. A circuit arrangement for providing read-modify-write memory, the circuit arrangement comprising:
    a memory having at least one read-or-write bank and further comprising a read-modify-write bank electrically coupled to the at least one read-or-write bank; and
    control circuitry adapted for using at most one access to each said at least one read-or-write bank for each read-modify-write access to the memory during a single memory access cycle;
    wherein the circuit arrangement is adapted to use at most one access to each said at least one read-or-write bank and only one access to the read-modify-write bank for each read-modify-write access to the memory; and
    wherein the storage capacity of the read-modify-write bank is at least the storage capacity of the largest read-or-write bank.

4. A circuit arrangement for providing read-modify-write memory, the circuit arrangement comprising:
    a memory having at least one read-or-write bank and further comprising a read-modify-write bank electrically coupled to the at least one read-or-write bank;
    control circuitry adapted for using at most one access to each said at least one read-or-write bank for each read-modify-write access to the memory during a single memory access cycle; and
    at least one pipeline register adapted to store data;
    wherein the circuit arrangement is adapted to use at most one access to each said at least one read-or-write bank and only one access to the read-modify-write bank for each read-modify-write access to the memory; and
    wherein the storage capacity of the read-modify-write bank is at least the storage capacity of a largest one of the read-or-write banks less the storage capacity of the pipeline registers.

5. A circuit arrangement for providing read-modify-write memory, the circuit arrangement comprising:
    a memory having at least one read-or-write bank and further comprising a read-modify-write bank electrically coupled to the at least one read-or-write bank; and
    control circuitry adapted for using at most one access to each said at least one read-or-write bank for each read-modify-write access to the memory during a single memory access cycle;

wherein the circuit arrangement is adapted to use at most one access to each said at least one read-or-write bank and only one access to the read-modify-write bank for each read-modify -write access to the memory; and wherein memory addresses in the circuit arrangement are partitioned into a bank address that identifies a particular read-or-write bank and a row address that identifies a particular word within the read-or-write bank.

6. A circuit arrangement for providing read-modify-write memory, the circuit arrangement comprising:

a memory having at least one read-or-write bank and further comprising a read-modify-write bank electrically coupled to the at least one read-or-write bank; and control circuitry adapted for using at most one access to each said at least one read-or-write bank for each read-modify-write access to the memory during a single memory access cycle and adapted to provide control signals for effecting the at most one access to each said at least one read-or-write bank for each read-modify-write access to the memory;

wherein the circuit arrangement is adapted to use at most one access to each said at least one read-or-write bank and only one access to the read-modify-write bank for each read-modify-write access to the memory.

7. A circuit arrangement for providing read-modify-write memory, the circuit arrangement comprising:

a memory having at least one read-or-write bank electrically coupled to a read-modify-write bank having a tag that indicates a read-or-write bank to which data in the read-modify-write bank belongs; and control circuitry adapted for using at most one access to each said at least one read-or-write bank and one access to the read-modify-write bank, for each read-modify-write access to the memory during a single memory access cycle.

8. The circuit arrangement of claim 7, wherein, in response to a read-modify-write request for the read-or-write bank corresponding to the tag, the control circuitry is adapted to cause data from the read-modify-write bank to be read, modified and written back to the read-modify-write bank.

9. The circuit arrangement of claim 8, wherein the control circuitry is further adapted to cause the modified data to be written to the read-or-write bank corresponding to the tag.

10. The circuit arrangement of claim 7, wherein, in response to a read-modify-write request for a read-or-write bank that does not correspond to the tag, the control circuitry is adapted to cause data in the read-modify-write bank to be written to a read-or-write bank corresponding to the tag and to cause data from the read-or-write bank for which the read-modify-write request was made to be read, modified and written to the read-modify-write bank.

11. The circuit arrangement of claim 7, wherein the read-modify-write bank has a smaller cycle time than said at least one read-or-write bank.

12. The circuit arrangement of claim 7, wherein the read-modify-write bank includes a dual-ported bank adapted to allow a read and a write access on every data bank cycle.

13. The circuit arrangement of claim 7, wherein the read-modify-write bank includes two read-or-write banks augmented with a ping-pong bit per word.

14. The circuit arrangement of claim 13, wherein the ping-pong bit is adapted to indicate which of the two read-or-write banks has valid data to be read, the control circuitry being adapted to cause data to be written to one of the two read-or-write banks indicated as not having valid data to be read, and to toggle the ping-pong bit to indicate that the one of the two read-or-write banks that was written to has valid data.

15. The circuit arrangement of claim 7, wherein the tag has a read cycle time smaller than the sum of the read cycle time and write cycle time of the at least one read-or-write bank.

16. A method for providing read-modify-write memory from a memory having at least one read-or-write bank, the method comprising:

using at most one access to each said at least one read-or-write bank for each read-modify-write access to the memory during a single memory access cycle, including using a control circuit adapted to effect the read-modify-write access using at most one access to each said at least one read-or-write bank.

17. The method of claim 16, wherein using at most one access includes using at most one read access.

18. The method of claim 16, wherein using at most one access includes using at most one write access to each said at least one read-or-write bank for each read-modify-write access to the memory.

19. A method for providing read-modify-write memory from a memory having at least one read-or-write bank, the method comprising:

using at most one access to each said at least one read-or-write bank for each read-modify-write access to the memory during a single memory access cycle, including using at least one read-modify-write cache.

20. The method of claim 19, wherein using at most one access to each said at least one read-or-write bank includes using a plurality of read-or-write banks.

21. A method for providing read-modify-write memory from a memory having at least one read-or-write bank, the method comprising:

using at most one access to each said at least one read-or-write bank for each read-modify-write access to the memory during a single memory access cycle, including reading a word from a read-or-write bank that is adapted for destructive reading and writing the unmodified read word back into the read-or-write bank that it was read from.

22. A method for providing read-modify-write memory from a memory having at least one read-or-write bank, the method comprising:

using at most one access to each said at least one read-or-write bank for each read-modify-write access to the memory during a single memory access cycle, including error-correction of encoded words with partial word writes, the method further comprising:

reading an encoded word from the at least one read-or-write bank;

decoding the encoded word;

modifying the decoded word by inserting a partial word;

re-encoding the modified decoded word; and writing the re-encoded word into the at least one read-or-write bank.

23. A method for providing read-modify-write memory from a memory having at least one read-or-write bank, the method comprising:

using at most one access to each said at least one read-or-write bank for each read-modify-write access to the memory during a single memory access cycle, including overlapping a read-modify-write cache access with the read-or-write bank access such that the read-modify-write cycle time is smaller than the sum of the slowest read-or-write bank's read cycle time and write cycle time.

24. The method of claim 23, wherein overlapping the read-modify-write cache access with the read-or-write bank access includes using a pipeline register to store data during the read-modify-write access to the memory.

25. A method for providing read-modify-write memory from a memory having at least one read-or-write bank, the method comprising:

using at most one access to each said at least one read-or-write bank for each read-modify-write access to the memory during a single memory access cycle, including performing a late select that includes simultaneously effecting a read of the addressed read-or-write bank and a read of a tag that indicates which read-or-write bank's data is in a cache, wherein data from the read-or-write bank is returned in response to the tag indicating that the data in the cache does not correspond to the addressed read-or-write bank and wherein data from the cache is returned in response to the tag indicating that the data in the cache corresponds the addressed read-or-write bank.

26. A method for providing read-modify-write memory from a memory having at least one read-or-write bank, the method comprising:

receiving an incoming address request;

reading a word from a row of a read-or-write bank corresponding to the incoming address;

reading a word from a row of a cache corresponding to the row of the read-or-write bank;

reading a tag of the cache that indicates which read-or-write bank's word is contained in the cache;

in response to the tag indicating that the cache contains the word of the read-or-write bank corresponding to the incoming address, returning data from the cache for the read access; and in response to the tag not indicating that the cache contains the word of the read-or-write bank corresponding to the incoming address, returning data from the read-or-write bank for the read access.

27. The method of claim 26, wherein the cache includes a read-modify-write bank.

28. The method of claim 26, wherein reading the tag includes reading the tag while reading the word from the row of the cache.

29. The method of claim 28, herein reading the word from the row of the read-or-write bank and reading the word from the row of the cache includes simultaneously reading the words from the read-or-write bank and the cache.

30. The method of claim 26, wherein reading the tag includes reading the tag before reading the word from the read-or-write bank.

31. The method of claim 26, wherein reading the tag includes reading the tag before reading the word from the cache.

32. The method of claim 26, wherein reading the tag includes reading the tag before reading the word from the reader-write bank and before reading the word from the cache.

33. The method of claim 26, wherein effecting a read access from the memory includes effecting a read access for a cache miss, further comprising writing data read from the word of the read-or-write bank into the cache.

34. The method of claim 33, further comprising writing the word read from the cache to the read-or-write bank indicated on the tag, prior to writing data read from the word of the row of the read-or-write bank into the cache.

35. The method of claim 34, further comprising updating the cache tag to indicate which read-or-write bank's word was written into the cache.

36. The method of claim 26, wherein effecting a read access from the memory includes effecting a read access for a cache hit, further comprising writing the word read from the cache back into the cache.

37. The method of claim 36, further comprising writing the tag back into the cache.

38. The method of claim 36, further comprising writing the word read from the cache into the read-or-write bank indicated by the tag, wherein reading the tag includes reading the tag before reading the word from the read-or write bank.

39. A method for providing read-modify-write memory from a memory having at least one read-or-write bank, the method comprising:

receiving an incoming address request for a write access to the memory;

reading a tag of a cache having a word for one of the at least one read-or-write banks stored therein, the tag indicating which read-or-write bank's word is stored in the cache;

in response to the tag indicating that the cache contains the word of the read-or-write bank corresponding to the incoming address request, writing data to the cache for the write access; and in response to the tag not indicating that the cache contains the word of the read-or-write bank corresponding to the incoming address request, writing data to the read-or-write bank for the write access.

40. The method of claim 39, further comprising writing the data written to the cache into the read-or-write bank in response to the tag indicating that the cache contains the word of the read-or-write bank corresponding to the incoming address request.

41. A method for providing read-modify-write memory from a memory having at least one read-or-write bank, the method comprising:

receiving an incoming address request for a write access to the memory;

reading a tag of a cache having a word for one of the at least one read-or-write banks stored therein, the tag indicating which read-or-write bank's word is stored in the cache; and in response to the tag indicating that the cache contains the word of the read-or-write bank corresponding to the incoming address request, writing data to the read-or-write bank corresponding to the incoming address request for the write access and invalidating the data in the cache.

42. A method for providing read-modify-write memory from a memory having at least one read-or-write bank, the method comprising:

receiving an incoming address request for a write access to the memory;

reading a tag of a cache having a word for one of the at least one read-or-write banks stored therein, the tag indicating which read-or-write bank's word is stored in the cache; and in response to the tag indicating that the cache does not contain the word of the read-or-write bank corresponding to the incoming address request, writing data from the cache to the read-or-write bank corresponding to the cache tag.

43. The method of claim 42, further comprising writing incoming data to the cache.

44. The method of claim 43, further comprising writing incoming data to the read-or-write bank corresponding to the incoming address request.

45. The method of claim 42, further comprising writing incoming data to the read-or-write bank corresponding to the incoming address request.

46. The method of claim 42, further comprising updating the tag of the cache to indicate the address of the read-or-write bank corresponding to the incoming address request.

47. The method of claim 42, further comprising invalidating the tag of the cache.

48. A method for providing read-modify-write memory from a memory having at least one read-or-write bank, the method comprising:
  receiving an incoming address request;
  reading a word from a row of a cache corresponding to the row of the read-or-write bank at the incoming address;
  reading a tag of the cache that indicates which read-or-write bank's word is stored in the cache;
  in response to the tag indicating that the cache contains the word of the read-or-write bank corresponding to the incoming address, modifying the word read from the cache and writing the modified word back to the cache; and
  in response to the tag not indicating that the cache contains the word of the read-or-write bank corresponding to the incoming address, writing the word read from the cache to the read-or-write bank corresponding to the tag, reading a word from the row of the read-or-write bank corresponding to the incoming address, modifying the word read from the read-or-write bank corresponding to the incoming address, writing the modified word to the cache and updating the tag to indicate that the word in the cache contains the word from the read-or-write bank corresponding to the incoming address.

49. The method of claim 48, further comprising reading a word from a row of a read-or-write bank corresponding to the incoming address in response to the tag indicating that the cache contains the word of the read-or-write bank corresponding to the incoming address.

50. A method for providing read-modify-write memory from a memory having at least one read-or-write bank, the method comprising:
  using at most one access to each said at least one read-or-write bank for each read-modify-write access to the memory during a single memory access cycle; and
  using at least one pipeline register to store data, including separating a cache read from a read-or-write bank write.

51. A method for providing read-modify-write memory from a memory having at least one read-or-write bank, the method comprising:
  using at most one access to each said at least one read-or-write bank for each read-modify-write access to the memory during a single memory access cycle; and
  using at least one pipeline register to store data, including using pipeline forwarding.

52. The method of claim 51, wherein using pipeline forwarding includes using the pipeline forwarding to tolerate arbitrary latency between the read and the write portion of a read-modify-write operation.

53. A method for providing read-modify-write memory from a memory having at least one read-or-write bank, the method comprising:
  using at most one access to each said at least one read-or-write bank for each read-modify-write access to the memory during a single memory access cycle; and
  writing a partial word to at least one of the said at least one read-or-write bank;
  wherein writing a partial word comprises:
  reading a word from a read-or-write bank;
  replacing a portion of the read word with the partial word; and
  writing the work having the partial word back to the read-or-write bank.

54. The A method for providing read-modify-write memory from a memory having at least one read-or-write bank, the method comprising:
  using at most one access to each said at least one read-or-write bank for each read-modify-write access to the memory during a single memory access cycle; and writing a partial word to at least one of the said at least one read-or-write bank;
  wherein writing the partial word includes spatially separating memory cells accessed by the partial word from other memory cells in the word.

55. A method for providing read-modify-write memory from a memory having at least one read-or-write bank, the method comprising:
  using at most one access to each said at least one read-or-write bank for each read-modify-write access to the memory during a single memory access cycle; and writing a partial word to at least one of the said at least one read-or-write bank;
  wherein writing the partial word includes constructing logical memory out of a plurality of actual memories including the at least one read-or-write bank and writing a partial word to the actual memories.

56. A method for providing read-modify-write memory from a memory having at least one read-or-write bank wherein at most one access to each said at least one read-or-write bank is generated for each read-modify-write access to the memory, the method comprising:
  in response to receiving a read access request for an incoming address:
    reading a word from a row of a read-or-write bank corresponding to the incoming address;
    reading a word from a row of a cache corresponding to the row of the read-or-write bank;
    reading a tag of the cache that indicates which read-or-write bank's word is contained in the cache;
    in response to the tag indicating that the cache contains the word of the read-or-write bank corresponding to the incoming address, returning data from the cache for the read access; and
    in response to the tag not indicating that the cache contains the word of the read-or-write bank corresponding to the incoming address, returning data from the read-or-write bank for the read access;
  in response to receiving a write access request for an incoming address:
    reading a tag of the cache that indicates which read-or-write bank's word is contained in the cache;

in response to the tag indicating that the cache contains the word of the read-or-write bank corresponding to the incoming address request, writing data to the cache for the write access; and in response to the tag not indicating that the cache contains the word of the read-or-write bank corresponding to the incoming address request, writing data to the read-or-write bank for the write access; and in response to receiving a read-modify-write access request for an incoming address:

reading a word from a row of a cache corresponding to the row of the read-or-write bank;

reading a tag of the cache that indicates which read-or-write bank's word is contained in the cache;

in response to the tag indicating that the cache contains the word of the read-or-write bank corresponding to the incoming address, modifying the word read from the cache and writing the modified word back to the cache; and in response to the tag not indicating that the cache contains the word of the read-or-write bank corresponding to the incoming address, writing the word read from the cache to the read-or-write bank corresponding to the tag, reading a word from a row of a read-or-write bank corresponding to the incoming address, modifying the word read from the read-or-write bank corresponding to the incoming address, writing the modified word to the cache and updating the tag to indicate that the word in the cache contains the word from the read-or-write bank corresponding to the incoming address.

57. The method of claim 56, wherein reading a word from a row of a read-or-write bank corresponding to the incoming address in response to the tag not indicating that the cache contains the word of the read-or-write bank corresponding to the incoming address includes reading a word from a row of a read-or-write bank simultaneously with reading a tag of the cache.

\* \* \* \* \*